(12) United States Patent
Janesky et al.

(10) Patent No.: US 12,320,871 B2
(45) Date of Patent: Jun. 3, 2025

(54) YOKE STRUCTURES FOR MAGNETOMETERS

(71) Applicant: Apple Inc., Cupertino, CA (US)

(72) Inventors: Jason Janesky, Campbell, CA (US); Savas Gider, San Jose, CA (US)

(73) Assignee: Apple Inc., Cupertino, CA (US)

( * ) Notice: Subject to any disclaimer, the term of this patent is extended or adjusted under 35 U.S.C. 154(b) by 140 days.

(21) Appl. No.: 17/935,013

(22) Filed: Sep. 23, 2022

(65) Prior Publication Data

US 2024/0103100 A1    Mar. 28, 2024

(51) Int. Cl.
*G01R 33/09*    (2006.01)

(52) U.S. Cl.
CPC ......... *G01R 33/093* (2013.01); *G01R 33/091* (2013.01)

(58) Field of Classification Search
CPC ........ G01R 33/091; G01R 33/093; B60J 1/17; E05F 15/686; E05F 15/689; E05Y 2201/654; E05Y 2201/668; E05Y 2600/51; E05Y 2600/62; E05Y 2900/55; F16B 35/041
See application file for complete search history.

(56) References Cited

U.S. PATENT DOCUMENTS

| | | | | |
|---|---|---|---|---|
| 2002/0093761 A1* | 7/2002 | Payne | ................ | G11B 5/3183 |
| 2006/0198058 A1* | 9/2006 | Ide | ........................ | G11B 5/3929 |
| | | | | 360/324.11 |
| 2010/0307016 A1* | 12/2010 | Mayor | ................... | G01R 33/10 |
| | | | | 702/179 |
| 2014/0103915 A1* | 4/2014 | Satz | ........................ | G01R 33/09 |
| | | | | 324/207.25 |
| 2017/0212188 A1* | 7/2017 | Kikitsu | ................ | G01R 33/025 |
| 2019/0369169 A1* | 12/2019 | Gider | ................ | G01R 33/0082 |

FOREIGN PATENT DOCUMENTS

| CN | 110926506 B | * | 1/2022 | ............ | G01B 7/003 |
|---|---|---|---|---|---|
| JP | 2011085517 A | * | 4/2011 | | |

* cited by examiner

*Primary Examiner* — Alvaro E Fortich
(74) *Attorney, Agent, or Firm* — Fish & Richardson P.C.

(57) ABSTRACT

Embodiments are disclosed for yoke structures for improved magnetometer performance. In an embodiment, a magnetometer comprises: a yoke structure comprising at least one hard magnetic layer and at least one soft magnetic layer arranged along a dimension of the yoke structure, where a first coercivity of the at least one hard magnetic layer is greater than a second coercivity of the at least one soft magnetic layer; and at least one magnetic sensing element located in proximity to the at least one soft magnetic layer. In another embodiment, a magnetometer comprises: a multilayer yoke structure comprising layers of non-magnetic material and magnetic material along a dimension of the yoke structure; and at least one magnetic sensing element located in proximity to the yoke structure.

15 Claims, 6 Drawing Sheets

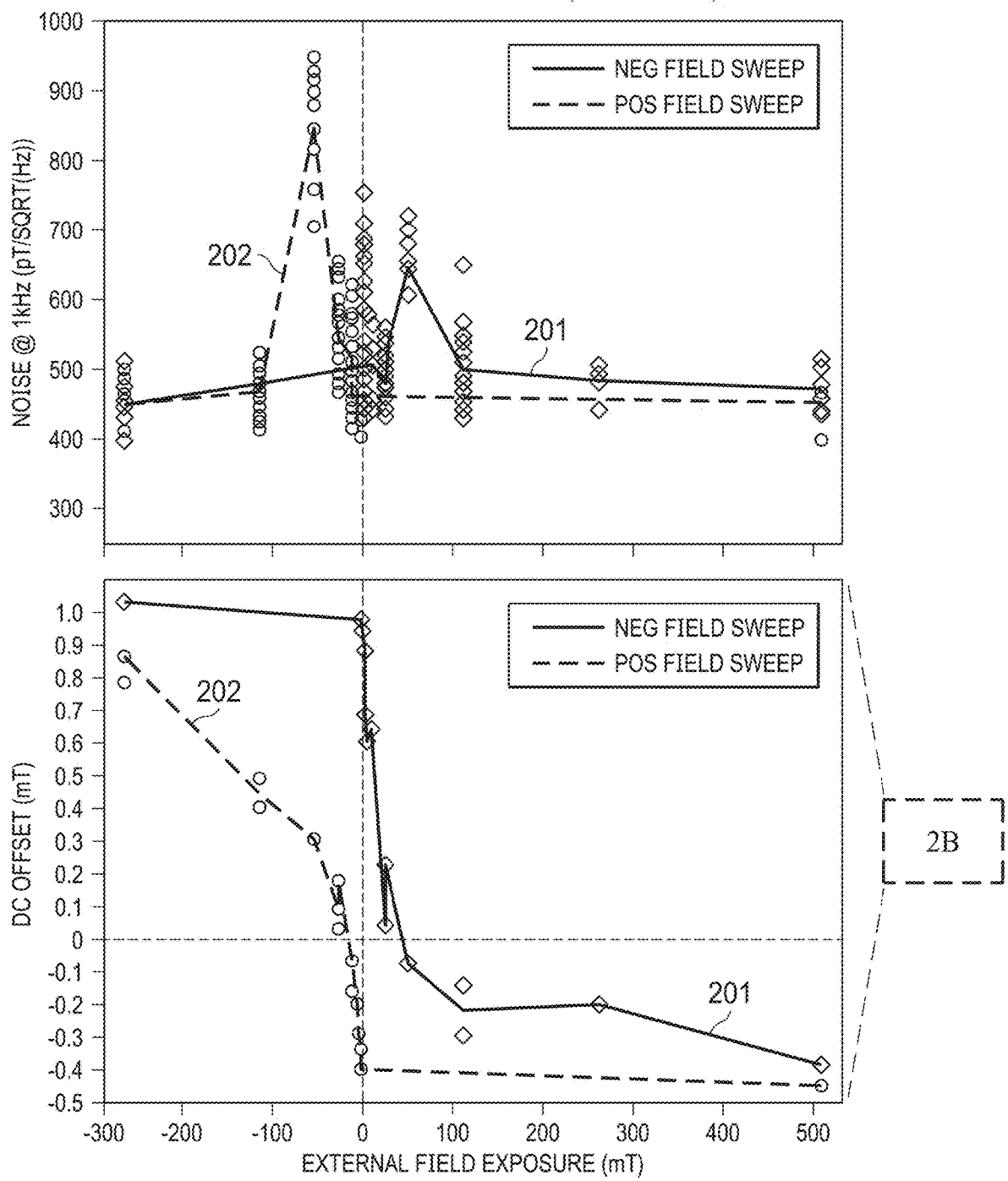

YOKE STRUCTURES FOR MAGNETOMETERS

TECHNICAL FIELD

This disclosure relates generally to yoke structures for magnetometers.

BACKGROUND

A magnetometer is a sensor that measures the magnitude and direction of a magnetic field (e.g., the Earth's magnetic field) at a particular location. A digital compass found on many consumer products (e.g., smart phones) uses a magnetometer to derive heading information to be used by a compass or navigation application. Some thin film magnetic field sensors are sensitive only to in-plane external fields. These sensors includes anisotropic magnetoresistance (AMR), giant MR (GMR) and tunneling MR (TMR) sensors. It is often desired that an out-of-plane magnetometer respond to out-of-plane fields (z axis sensitivity) and not to in-plane fields (cross-axis sensitivity). One solution is to connect different magnetic field sensors with opposite responses in a Wheatstone bridge to cancel any in-plane fields. This solution is difficult to accomplish for both in-plane fields. Another solution uses a magnetic yoke as a shield for the cross-axis direction and to redirect the flux to in-plane magnetic sensing elements.

FIG. 1 shows a generalized view of a typical yoke structure for a magnetometer. Yoke structure 100 is a rectangular structure of soft magnetic material (e.g., nickel-iron alloy (NiFE)) placed in close proximity to one or more magnetic sensing elements 101 to focus on or shield external fields from magnetic sensing elements 101. The position of yoke structure 100 to magnetic sensing elements 101 is adjusted to produce an optimized output which is typically increased sensitivity. Increased sensitivity can be used to lower the magnetometer noise and create a compact 3-axis magnetometer design. Different remanent magnetization states of yoke structure 100 can create large offsets, sensitivity shifts, and noise.

FIG. 2A illustrates changes in remanent offset and noise versus external field exposure. The top graph shows noise at 1 kHz (pT/sqrt(Hz)) versus external field exposure (mT) and the bottom graph shows DC offset (mT) versus external field exposure (mT). Plot 201 in the graphs is a negative to positive field sweep and plot 202 is a positive to negative field sweep. FIG. 2B is an annotated version of the bottom graph in FIG. 2A and includes arrow annotations 203 showing magnetization reversal of the yoke after external field exposure. The increase in noise shown in FIG. 2A corresponds to the transition in offset from negative to positive in FIG. 2B.

Ideally, there would be no change in these parameters from before to after the external field exposure allowing for a stable initial calibration through product lifetime. Changes in the magnetization state of the yoke structure can change the fields on the magnetic sensing elements and reduce the effectiveness of initial calibrations (see arrow annotations). Accordingly, yoke structures with a stable remanent magnetization state or with reduced impact from magnetization changes produces a stable product over lifetime.

SUMMARY

Embodiments are disclosed for yoke structures for improved magnetometer performance.

In an embodiment, a magnetometer comprises: a yoke structure comprising at least one hard magnetic layer and at least one soft magnetic layer arranged along a dimension of the yoke structure, where a first coercivity of the at least one hard magnetic layer is greater than a second coercivity of the at least one soft magnetic layer; and at least one magnetic sensing element located in proximity to the at least one soft magnetic layer.

In an embodiment, the first coercivity is greater than 10 mT.

In an embodiment, the at least one magnetic sensing element is located below the yoke structure.

In an embodiment, the at least one magnetic sensing element is located in-plane with the yoke structure.

In an embodiment, the at least one hard magnetic layer includes antiferromagnetic pinning material.

In an embodiment, the yoke structure is rectangular and the dimension is width. In an embodiment, the yoke structure is rectangular and the dimension is length, and the at least one hard magnetic material provides a bias direction for remanent states in the yoke structure.

In an embodiment, a magnetometer comprises: a multilayer yoke structure comprising alternating layers of non-magnetic material and magnetic material along a dimension of the yoke structure; and at least one magnetic sensing element located in proximity to the yoke structure.

In an embodiment, the non-magnetic material magnetically couples at least two layers of magnetic material.

In an embodiment, the non-magnetic material includes insulating material.

In an embodiment, thicknesses of the layers are in a range of about 1 to about 100 angstroms.

In an embodiment, the yoke structure is rectangular and the dimension is length.

In an embodiment, an electronic device comprises: a magnetometer comprising a yoke structure having at least one hard magnetic layer and at least one soft magnetic layer arranged along a dimension of the yoke structure, where a first coercivity of the at least one hard magnetic layer is greater than a second coercivity of the at least one soft magnetic layer, and at least one magnetic sensing element located in proximity to the at least one soft magnetic layer; and memory storing instructions that when executed by the one or more processors, cause the one or more processors to perform operations comprising: obtaining, by the one or more processors from the magnetometer, magnetometer output data; and determining, by the one or more processors, a directional heading or orientation of the electronic device using the magnetometer output data.

In an embodiment, the magnetometer comprises a multilayer yoke structure having alternating layers of non-magnetic material and magnetic material along a dimension of the yoke structure, and the at least one magnetic sensing element is located in proximity to the yoke structure.

Advantages of the disclosed embodiments include improved yoke structures that provide a stable reset direction for the magnetic material, which reduce the likelihood and/or impact of magnetic domain formation in the yoke structure, and thus provide repeatable magnetometer performance for offset, sensitivity and noise.

The details of one or more implementations of the subject matter are set forth in the accompanying drawings and the description below. Other features, aspects and advantages of the subject matter will become apparent from the description, the drawings and the claims.

BRIEF DESCRIPTION OF THE DRAWINGS

FIG. 2A illustrates changes in remanent offset and noise versus external field exposure.

DETAILED DESCRIPTION

Figure 1:
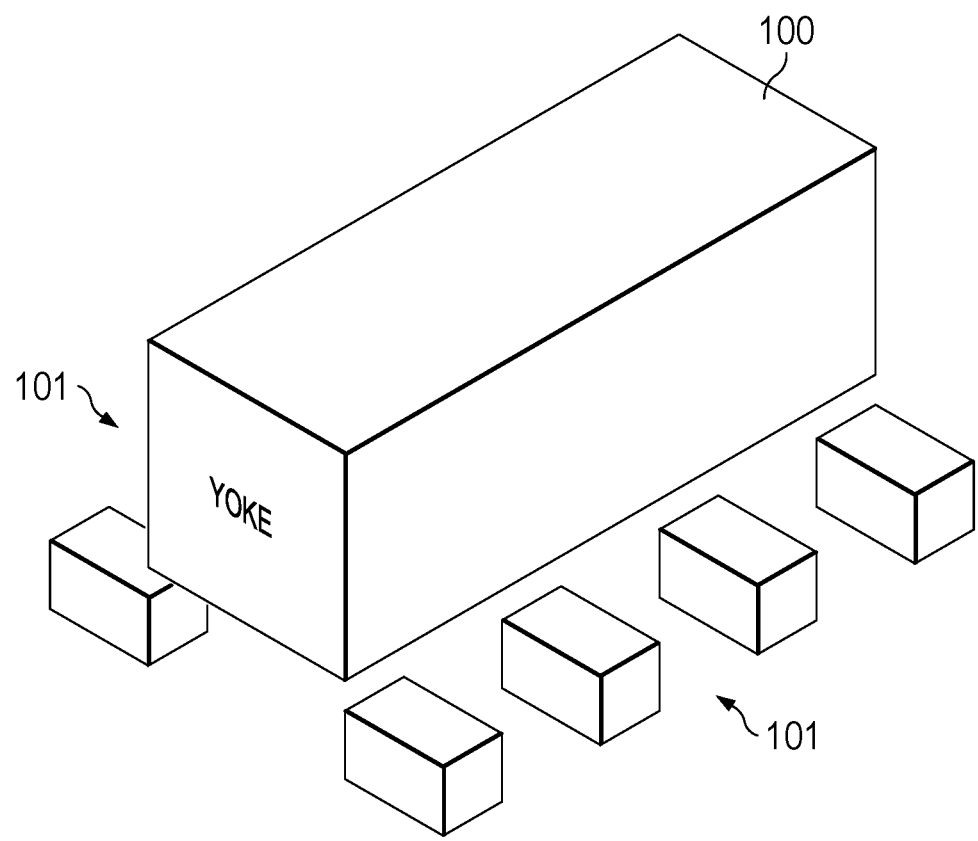
FIG. 1 illustrates a generalized view of a typical yoke structure for a magnetometer.
Figure 2B:
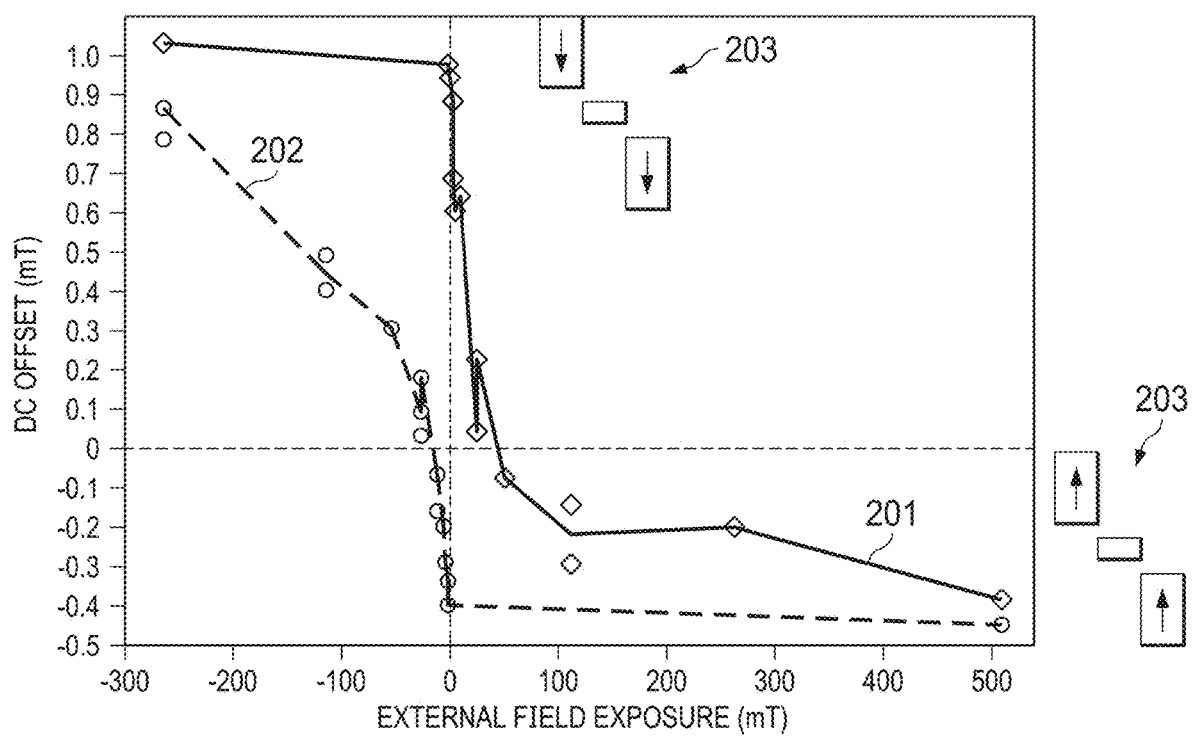
FIG. 2B is an annotated version of the bottom graph in FIG. 2A.
Figure 3A:
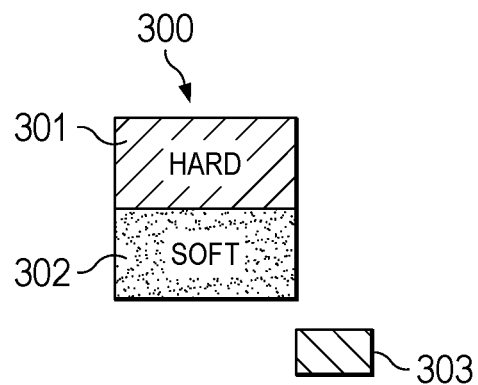
FIG. 3A shows cross-section of a width of a rectangular yoke structure with hard magnetic material disposed on top of soft magnetic material, and the magnetic sensing element located below the yoke structure, according to an embodiment.
Figure 3B:
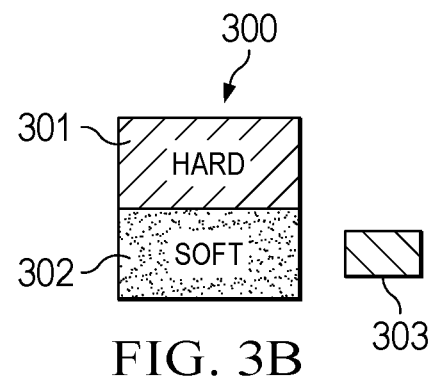
FIG. 3B shows the yoke structure of FIG. 3A with the magnetic sensing element located in-plane with the yoke structure, according to an embodiment.

FIG. 3A shows cross-section of a width of rectangular yoke structure 300 with hard magnetic material 301 disposed on top of soft magnetic material 302, and magnetic sensing element 303 located below yoke structure 300 and proximate to soft magnetic material 302, according to an embodiment. FIG. 3B shows the rectangular yoke structure of FIG. 3A where magnetic sensing element 303 is located in-plane with yoke structure 300 and proximate to soft magnetic material 302, according to an embodiment. Note that yoke structure 300 need not be rectangular but can be any suitable shape and size (e.g., cylindrical, u-shaped, square). Note that FIG. 3A shows sensing element 303 below yoke structure 300. In other embodiments, sensing elements can be above yoke structure 300 or in-plane with yoke structure 300.

Soft magnetic material 302 is easy to magnetized and demagnetized, exhibits a high value of saturation magnetization, low coercivity (the resistance of a magnetic material to changes in magnetization) and high permeability. Hard magnetic material 301 (a permanent magnet) exhibits high saturation magnetization, a higher coercivity than soft magnetic material 302 (e.g., >10 mT) and is difficult to magnetize and demagnetize. The direction of hard magnetization is either in or out of the plane of the yoke structure.

In an embodiment, hard magnetic material 301 can have an antiferromagnetic (AF) pinning material like manganese platinum alloy (PtMn), iridium manganese (IrMn), iron manganese (FeMn), rhodium manganese (RhMn) or any other suitable AF material. In an embodiment, hard magnetic material 301 is separated from soft magnetic material 302 by a barrier layer.

Figure 4:
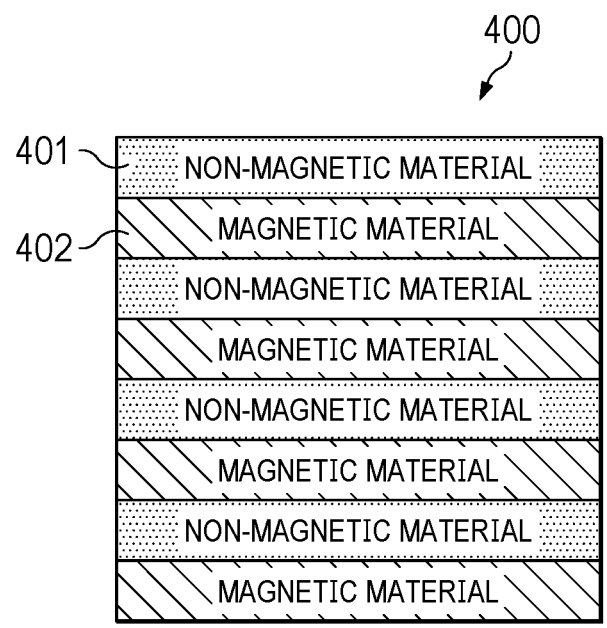
FIG. 4 shows a cross-section of a width of a rectangular, multilayer yoke structure, according to an embodiment.

FIG. 4 shows a cross-section of a width of a rectangular, multilayer yoke structure 400, according to an embodiment. In this embodiment, multilayer yoke structure 400 adds anisotropy through layers of non-magnetic material 401 and magnetic material 402. In some embodiments, multilayer yoke structure 400 adds anisotropy through alternating layers of non-magnetic material 401 and magnetic material 402, as shown. A higher material anisotropy correlates to a higher coercivity. Non-magnetic material 401 could magnetically couple neighboring magnetic material 402, such as ruthenium (Ru), iridium (Ir), platinum (Pt), palladium (Pd), or insulating material such as aluminum oxide (AlO) or magnesium oxide (MgO). The thicknesses of the layers can be from about 1 to about 100 A. One or more magnetic sensing elements can be located below, above or in-plane with yoke structure 400. Non-magnetic material 401 can be copper (Cu), aluminum (Al), magnesium (Mg), titanium (Ti), tungsten (W), aluminum monoxide (AlO), silicon mononitride (SiN), silicon oxide (SiO), tetraethyl orthosilicate (TEOS) or MgO.

Figure 5A:
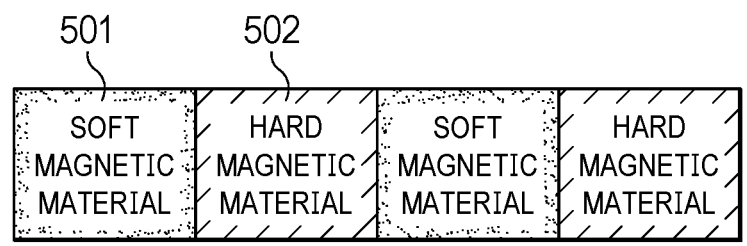
FIG. 5A shows a top down view along the length of a yoke structure that includes hard magnetic bias layers, according to an embodiment.

FIG. 5A shows a top down view along the length of a yoke structure 500 that includes hard magnetic bias structures, according to an embodiment. Yoke structure 500 comprises a number of alternating bias structures of soft magnetic material 501 and hard magnetic material 502. The use of hard magnetic bias structures 502 along the length of yoke structure 500 provides a bias direction for remanent states in yoke structure 500.

Figure 5B:
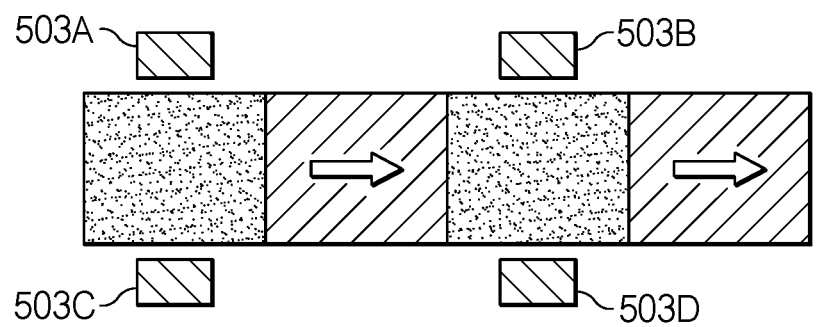
FIG. 5B shows the magnetization direction of the hard magnetic bias layers and the location of the magnetic sensing elements, according to an embodiment.

FIG. 5B shows the magnetization direction of hard magnetic bias structures 502 and the location of magnetic sensing elements 503, according to an embodiment. These magnetization directions provide a stable reset direction for the magnetization of soft magnetic bias structures 501 after field exposure. Magnetic sensing elements 503 are disposed adjacent to soft magnetic bias structures 501 and in-plane with yoke structure 500 or above or below yoke structure 500.

Although yoke structure 300, 400, and 500 improve magnetometer sensor performance, these yoke structures can also improve performance of any device that uses or could benefit from a yoke structure, such as a Hall sensor.

Figure 6:
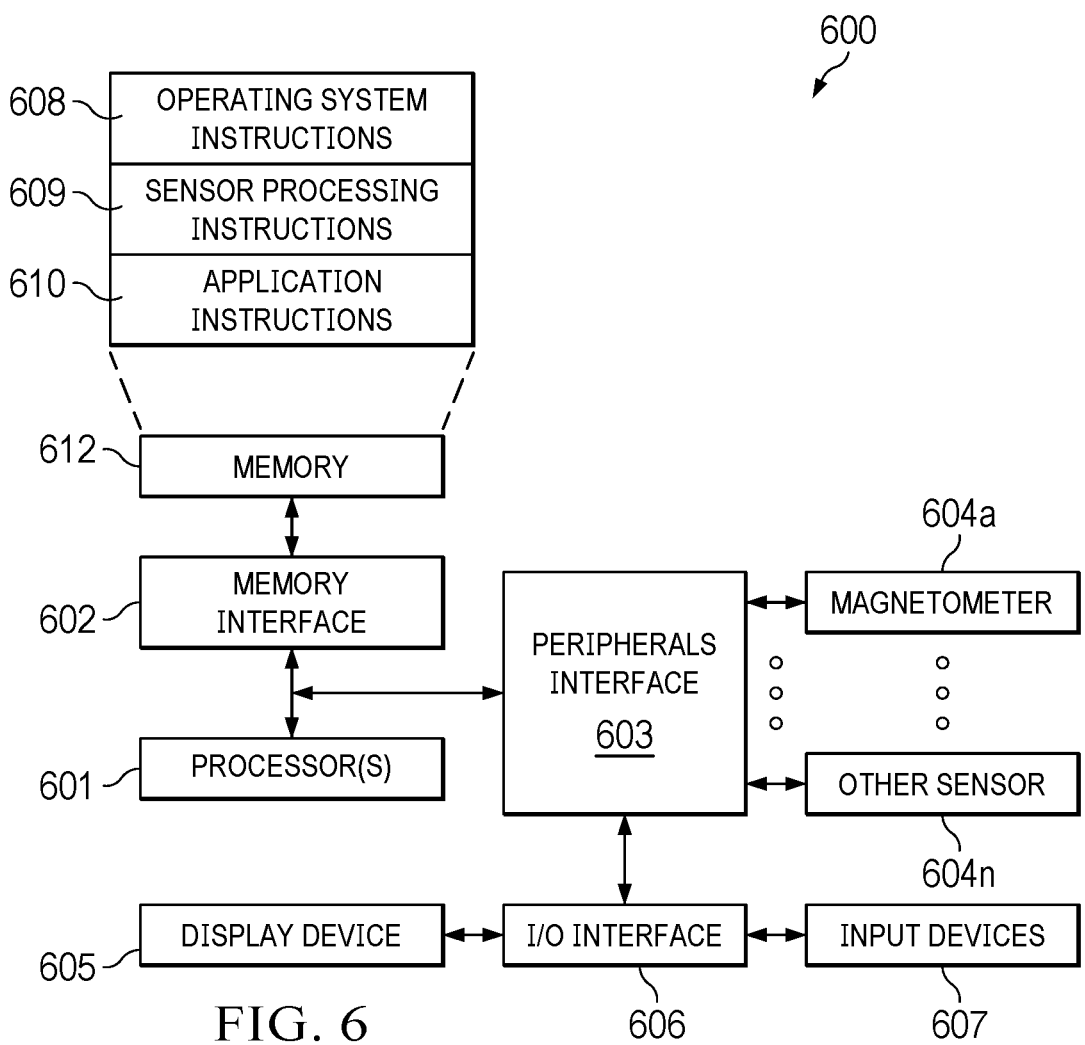
FIG. 6 is a block diagram of an electronic device architecture that includes at least one magnetometer as described in reference to FIGS. 1-5, according to an embodiment.

FIG. 6 is a block diagram of an electronic device architecture that includes at least one magnetometer as described in reference to FIGS. 3-5, according to an embodiment. Architecture 600 includes processor(s) 601, memory interface 602, peripherals interface 603, sensors 604a . . . 604n, display device 605 (e.g., touch screen, LCD display, LED display), I/O interface 606 and input devices 607 (e.g., touch surface/screen, hardware buttons/switches/wheels, virtual or hardware keyboard, mouse). Memory 612 can include high-speed random access memory and/or non-volatile memory, such as one or more magnetic disk storage devices, one or more optical storage devices and/or flash memory (e.g., NAND, NOR).

Memory 612 stores operating system instructions 608, sensor processing instructions 609 and application instructions 610. Operating system instructions 608 include instructions for implementing an operating system on the device, such as iOS, Darwin, RTXC, LINUX, UNIX, WINDOWS, or an embedded operating system such as VxWorks. Operating system instructions 608 may include instructions for handling basic system services and for performing hardware dependent tasks. Sensor-processing instructions 609 perform post-processing on sensor data (e.g., averaging, scaling, formatting, calibrating) and provide control signals to sensors. Application instructions 610 implement software programs that use data from one or more sensors 604a . . . 604n, such as navigation, digital pedometer, tracking or map applications, or any other application that needs heading or orientation data. At least one sensor 604a is a 3-axis magnetometer as described in reference to FIGS. 3-5.

For example, in a digital compass application executed on a smartphone, the raw magnetometer output data is provided to processor(s) 601 through peripheral interface 603. Processor(s) 601 execute sensor-processing instructions 609, to perform further processing (e.g., averaging, formatting, scaling) of the raw magnetometer output data. Processor(s) 601 execute instructions for various applications running on the smartphone. For example, a digital compass uses the magnetometer data to derive heading information to be used by a compass or navigation application. The more accurate the magnetometer data the more accurate the heading calculation for the electronic device. Other applications are also possible (e.g., navigation applications, gaming applications, calibrating other sensors).

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

Similarly, while operations are depicted in the drawings in a particular order, this should not be understood as requiring that such operations be performed in the particular order shown or in sequential order, or that all illustrated operations be performed, to achieve desirable results.

What is claimed is:

1. A magnetometer comprising:
   a yoke structure comprising at least one hard magnetic layer and at least one soft magnetic layer arranged along a dimension of the yoke structure, where a first coercivity of the at least one hard magnetic layer is greater than a second coercivity of the at least one soft magnetic layer, and where the hard magnetic layer provides a bias direction for remanent states in the yoke structure and a stable reset direction for magnetization of the soft magnetic layer after exposure to a magnetic field; and
   at least one magnetic sensing element located in proximity to the at least one soft magnetic layer.

2. The magnetometer of claim 1, wherein the first coercivity is greater than 10 mT.

3. The magnetometer of claim 1, wherein the at least one magnetic sensing element is located above or below the yoke structure.

4. The magnetometer of claim 1, wherein the at least one magnetic sensing element is located in-plane with the yoke structure.

5. The magnetometer of claim 1, wherein the at least one hard magnetic layer includes antiferromagnetic pinning material.

6. The magnetometer of claim 1, wherein the yoke structure is rectangular and the dimension is width.

7. The magnetometer of claim 1, wherein the yoke structure is rectangular and the dimension is length, and the at least one hard magnetic layer provides a bias direction for remanent states in the yoke structure.

8. An electronic device, comprising:
   a magnetometer comprising a yoke structure having at least one hard magnetic layer and at least one soft magnetic layer arranged along a dimension of the yoke structure, where a first coercivity of the at least one hard magnetic layer is greater than a second coercivity of the at least one soft magnetic layer, and at least one magnetic sensing element located in proximity to the at least one soft magnetic layer, and where the hard magnetic layer provides a bias direction for remanent states in the yoke structure and a stable reset direction for magnetization of the soft magnetic layer after exposure to a magnetic field;
   one or more processors; and
   memory storing instructions that when executed by the one or more processors, cause the one or more processors to perform operations comprising:
      obtaining, by the one or more processors from the magnetometer, magnetometer output data; and
      determining, by the one or more processors, a directional heading or orientation of the electronic device using the magnetometer output data.

9. The electronic device of claim 8, wherein the first coercivity is greater than 10 mT.

10. The electronic device of claim 8, wherein the at least one magnetic sensing element is located above or below the yoke structure.

11. The electronic device of claim 8, wherein the at least one magnetic sensing element is located in-plane with the yoke structure.

12. The electronic device of claim 8, wherein the at least one hard magnetic layer includes antiferromagnetic pinning material.

13. The electronic device of claim 8, wherein the yoke structure is rectangular and the dimension is width.

14. The electronic device of claim 8, wherein the yoke structure is rectangular and the dimension is length, and the at least one hard magnetic layer provides a bias direction for remanent states in the yoke structure.

15. The electronic device of claim 8, wherein the yoke structure having alternating layers of soft magnetic material and hard magnetic material along a dimension of the yoke structure, and the at least one magnetic sensing element is located in proximity to the yoke structure.

* * * * *